(12) United States Patent
Yang

(10) Patent No.: US 11,861,929 B2
(45) Date of Patent: Jan. 2, 2024

(54) DISPLAY APPARATUS AND BONDING METHOD THEREFOR

(71) Applicants: Chengdu BOE Optoelectronics Technology Co., Ltd., Chengdu (CN); BOE Technology Group Co., Ltd., Beijing (CN)

(72) Inventor: Shuquan Yang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 426 days.

(21) Appl. No.: 17/265,191

(22) PCT Filed: May 19, 2020

(86) PCT No.: PCT/CN2020/091123
§ 371 (c)(1),
(2) Date: Feb. 1, 2021

(87) PCT Pub. No.: WO2020/238705
PCT Pub. Date: Dec. 3, 2020

(65) Prior Publication Data
US 2021/0224507 A1  Jul. 22, 2021

(30) Foreign Application Priority Data
May 31, 2019  (CN) .......................... 201910471381.4

(51) Int. Cl.
*G06V 40/13* (2022.01)
*B32B 37/12* (2006.01)
(Continued)

(52) U.S. Cl.
CPC .......... *G06V 40/1318* (2022.01); *B32B 37/12* (2013.01); *G06F 1/20* (2013.01); *H05K 7/20963* (2013.01); *B32B 2457/20* (2013.01)

(58) Field of Classification Search
CPC .... G06V 40/1318; G06V 40/13; B32B 37/12; B32B 2457/20; G06F 1/20;
(Continued)

(56) References Cited

U.S. PATENT DOCUMENTS

2013/0181213 A1  7/2013  Han et al.
2017/0061193 A1*  3/2017  Young ................ G06V 40/1306
(Continued)

FOREIGN PATENT DOCUMENTS

CN  201611040862  *  5/2017  ............. H01L 24/02
CN  108549499 A   9/2018
(Continued)

OTHER PUBLICATIONS

CN201910471381.4 First Office Action.
CN201910471381.4 Second Office Action.

*Primary Examiner* — Sardis F Azongha
(74) *Attorney, Agent, or Firm* — IPro, PLLC

(57) ABSTRACT

A display apparatus and a bonding method therefor are provided. The display apparatus includes a display module, the back face of the display module having a heat dissipation film layer, a first open hole being disposed in the heat dissipation film layer, a composite film layer being provided in the first open hole, and a fingerprint module being attached to the composite film layer; the composite film layer includes a support layer and a buffer layer attached to one another, the support layer being closest to the fingerprint module.

14 Claims, 2 Drawing Sheets

(51) Int. Cl.
*G06F 1/20* (2006.01)
*H05K 7/20* (2006.01)

(58) Field of Classification Search
CPC ........... G06F 2200/1612; G06F 1/1601; G06F 1/1637; G06F 1/1684; G06F 1/203; H05K 7/20963; G09F 9/00
See application file for complete search history.

(56) References Cited

U.S. PATENT DOCUMENTS

| | | | |
|---|---|---|---|
| 2017/0372115 A1* | 12/2017 | Lee | G06V 40/12 |
| 2018/0293420 A1* | 10/2018 | Kim | G06F 3/0421 |
| 2020/0273849 A1 | 8/2020 | Wang et al. | |
| 2021/0224507 A1 | 7/2021 | Yang | |

FOREIGN PATENT DOCUMENTS

| | | |
|---|---|---|
| CN | 109273513 A | 1/2019 |
| CN | 109614961 A | 4/2019 |
| CN | 109886224 A | 6/2019 |
| CN | 110197160 A | 9/2019 |

\* cited by examiner

US 11,861,929 B2

DISPLAY APPARATUS AND BONDING METHOD THEREFOR

CROSS-REFERENCE TO RELATED APPLICATIONS

The present disclosure claims priority to Chinese Patent Application No. 201910471381.4, filed to the Patent Office of the People's Republic of China on May 31, 2019 and entitled "DISPLAY PANEL, DISPLAY APPARATUS AND BONDING METHOD FOR FINGERPRINT MODULE", the entire contents of which are incorporated herein by reference.

FIELD

The present disclosure relates to the field of display, in particular to a display apparatus and a bonding method therefor.

BACKGROUND

At present, for a flat panel display screen such as an OLED display panel, in order to achieve the display effect of a full screen and increase the screen-to-body ratio, a feasible scheme includes that a fingerprint sensor is placed below a screen display area, namely, an under-screen fingerprint module is adopted. At present, a commonly used under-screen fingerprint module generally adopts an optical or ultrasonic fingerprint module.

SUMMARY

An embodiment of the present disclosure provides a display apparatus, including:

a display module;

a heat dissipation film layer, located on a back face of the display module, the heat dissipation film layer includes a first open hole;

a composite film layer, fixed in the first open hole and including a second open hole, the composite film layer includes a support layer and a buffer layer which are attached to each other, and the buffer layer is close to the display module; and a fingerprint module, fixed on a side, facing away from the display module, of the composite film layer, the fingerprint module comprises a sensor accommodated in the second open hole.

In some embodiments of the display apparatus, the display apparatus further includes a back film located between the display module and the heat dissipation film layer.

In some embodiments of in the display apparatus, a side, away from the second open hole, of the support layer extends out of the first open hole and covers a portion, adjacent to the first open hole, of the heat dissipation film layer.

In some embodiments of in the display apparatus, a length of the portion, extending out of the first open hole, of the support layer is greater than 0.2 mm.

In some embodiments of the display apparatus, the display apparatus further includes edge sealing glue arranged around a side face of the fingerprint module, and the edge sealing glue covers the portion, extending out of the first open hole, of the support layer and a portion, adjacent to the extending portion, of the heat dissipation film layer.

In some embodiments of in the display apparatus, the support layer and the buffer layer are aligned to each other at side edges thereof close to the second open hole.

In some embodiments of in the display apparatus, a shape of the second open hole is matched with a shape of the sensor.

In some embodiments of in the display apparatus, a gap layer is formed in the second open hole and located between the sensor and the display module.

In some embodiments of in the display apparatus, the support layer and the buffer layer are bonded through a pressure-sensitive adhesive.

In some embodiments of in the display apparatus, the support layer and the fingerprint module are bonded through a pressure-sensitive adhesive.

In some embodiments of in the display apparatus, the buffer layer and the display module are bonded through a pressure-sensitive adhesive.

In some embodiments of in the display apparatus, the buffer layer is made of foam, polystyrene foam plastic or polyethylene foam plastic.

In some embodiments of in the display apparatus, the support layer is made of PMMA or PC.

An embodiment of the present disclosure further provides a bonding method for the display apparatus according to aforementioned embodiments, including:

bonding the support layer of the composite film layer to the fingerprint module; and bonding the buffer layer of the composite film layer to the interior of the first open hole of the heat dissipation film layer on the back face of a display module.

In some embodiments of the bonding method, the bonding method further includes: arranging edge sealing glue on the side surface of the fingerprint module.

DETAILED DESCRIPTION OF THE EMBODIMENTS

Figure 4:
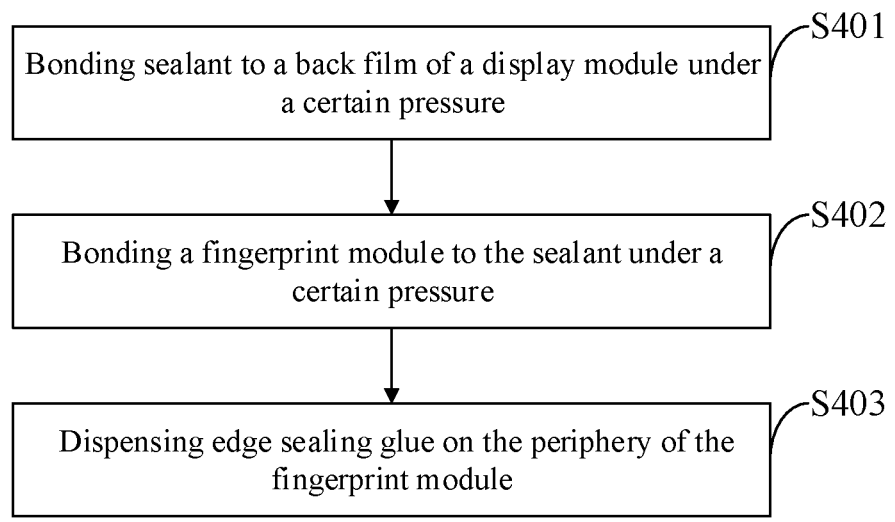
FIG. 4 is a flowchart of a bonding method for a display apparatus in the related art.
Figure 5:
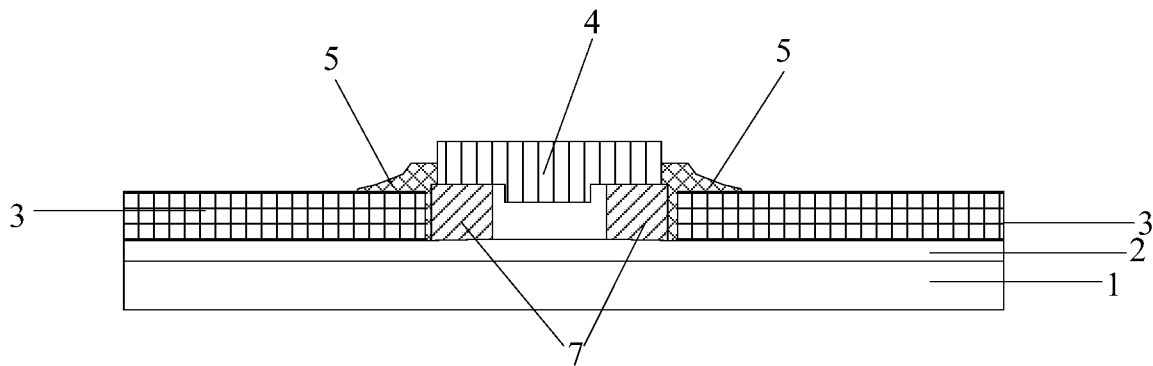
FIG. 5 is a structure schematic diagram of a display apparatus in the related art.

At present, in an under-screen fingerprint identification technology in the display field, as shown in FIG. 4, a fingerprint module bonding process in a display apparatus generally includes the following steps: S401, bonding sealant 7 to a back film 2 of a display module 1 under a certain pressure, and optionally bonding the sealant 7 to the interior of an open hole of a heat dissipation film layer 3; S402, bonding the fingerprint module 4 to the sealant 7 under a certain pressure; and S403, dispensing edge sealing glue 5 on the periphery of the fingerprint module 4 for fixing the fingerprint module 4. The bonded display apparatus is shown in FIG. 5, and the edge sealing glue 5 is bonded to the back film 2 through a gap between the sealant 7 and the heat dissipation film layer 3.

According to the bonding mode, due to the fact that the fingerprint module 4 is directly bonded to the back film 2 of the display module 1, the display module 1 is subject to two-time bonding stress of bonding of the sealant 7 and bonding of the fingerprint module 4, and the display module 1 is impacted by local bonding pressure; moreover, because the thermal expansion coefficients and Young modulus of the sealant 7, the edge sealing glue 5 and the back film 2 of the display module 1 are inconsistent, lamination impression and reliability impression are aggravated, the impressions appear in the area of the fingerprint module 4 in a point screen display process, and the display effect is influenced.

The present disclosure is described in optional detail below in connection with the accompanying drawings and embodiments. It can be understood that embodiments described herein are for purposes of explanation only of the relevant disclosure and not of limitation thereof. It should also be noted that, for ease of description, only portions of the drawings related to the disclosure are shown.

It should be noted that embodiments of the present disclosure and features of embodiments may be combined with each other without conflict. The present disclosure will be described in detail below with reference to the accompanying drawings in conjunction with embodiments.

Figure 1:
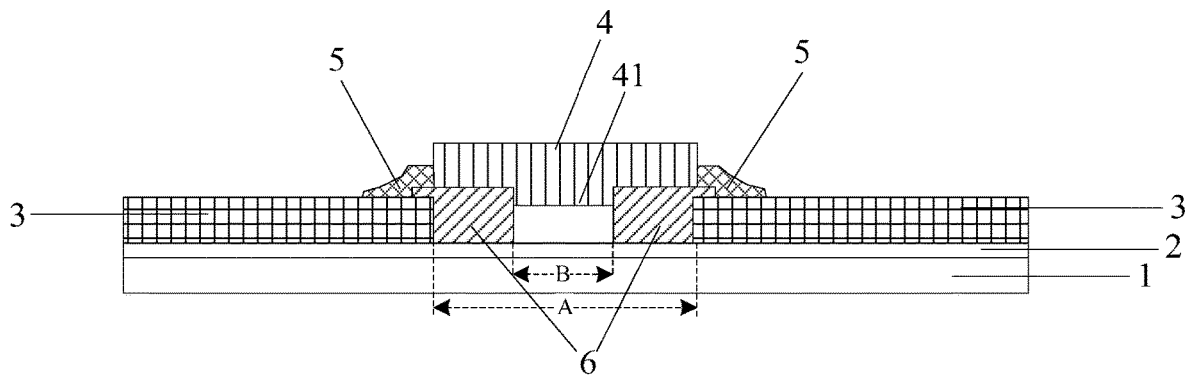
FIG. 1 is a structure schematic diagram of a display apparatus provided by an embodiment of the present disclosure.
Figure 2:
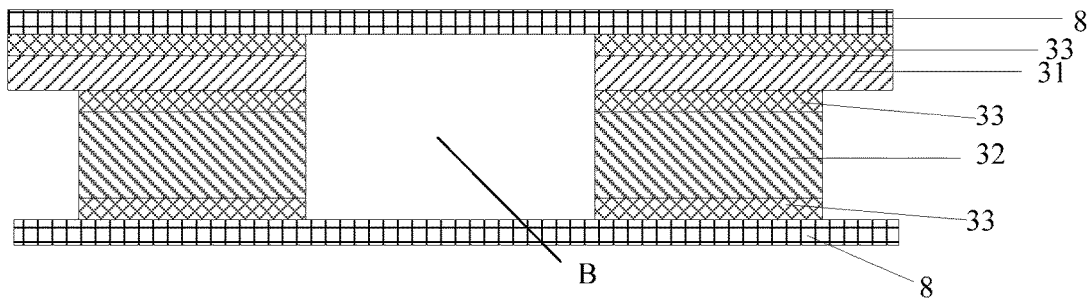
FIG. 2 is a structure schematic diagram of a composite film layer in a display apparatus provided by an embodiment of the present disclosure.

Referring to FIG. 1, an embodiment of the present disclosure provides a display apparatus, including:

a display module 1;

a heat dissipation film layer 3, located on the back face of the display module 1, wherein the heat dissipation film layer is provided with a first open hole A;

a composite film layer 6, fixed in the first open hole A and provided with a second open hole B, wherein as shown in FIG. 2, the composite film layer 6 includes a support layer 31 and a buffer layer 32 which are attached to each other, and the buffer layer 32 is close to the display module 1; and a fingerprint module 4, fixed on the side, facing away from the display module 1, of the composite film layer 6, wherein the fingerprint module 4 is provided with a sensor 41 accommodated in the second open hole B.

Optionally, in the display apparatus provided by an embodiment of the present disclosure, the composite film layer 6 is adopted to replace sealant to serve as a connecting structure between the fingerprint module 4 and the display module 1, the composite film layer 6 includes a support layer 31 and a buffer layer 32 which are attached to each other, the support layer 31 plays a role in securing and supporting the fingerprint module 1, and the buffer layer 32 is close to the display module 1 and can absorb stress in a bonding process, so that local stress effect of bonding pressure on the display module 1 is reduced, impressions caused by the bonding pressure are eliminated, and the product yield is improved.

Optionally, in the display apparatus provided by an embodiment of the present disclosure, as shown in FIG. 2, the buffer layer 32 and the support layer 31 may be bonded through a pressure-sensitive adhesive 33. Meanwhile, two unconnected surfaces of the buffer layer 32 and the support layer 31 are coated with pressure-sensitive adhesives 33. Before the composite film layer 6 is bonded to the fingerprint module 4 or the display module 1, release films 8 are attached to the two outermost side surfaces of the composite film layer 6, when bonding needs to be carried out, the release films 8 are removed, and the pressure-sensitive adhesives 33 are exposed for bonding. Namely, the support layer 31 and the fingerprint module 4 may be bonded through the pressure-sensitive adhesive 33, and the buffer layer 32 and the display module 1 may be bonded through the pressure-sensitive adhesive 33. The composite film layer 6 is bonded to the fingerprint module 4 and the display module 1 respectively through the pressure-sensitive adhesives 33, and due to the fact that the pressure-sensitive adhesive 33 has high peeling strength, it can be guaranteed that the display module 1 and the fingerprint module 4 can be well fixed to the composite film layer 6.

Optionally, in the display apparatus provided by an embodiment of the present disclosure, as shown in FIG. 1, the display apparatus further includes a back film 2 located between the display module 1 and the heat dissipation film layer 3, and the back film 2 is arranged on the whole back face of the display module 1 and can play a role in protecting the display module 1. The back film 2 is generally made of a transparent material so that the sensor 41 can acquire a fingerprint image through the back film 2.

Optionally, in the display apparatus provided by an embodiment of the present disclosure, as shown in FIG. 1 and FIG. 2, the side, away from the second open hole B, of the support layer 31 can extend out of the first open hole A and covers the portion, adjacent to the first open hole A, of the heat dissipation film layer 3.

Optionally, by arranging a portion extending out of the buffer layer 32 on the support layer 31, it can be guaranteed that when the composite film layer 6 is bonded to the display module 1, the extending portion of the support layer 31 will be lapped on the portion, at the edge of the first open hole A, of the heat dissipation film layer 3, the heat dissipation film layer 3 is partially covered through the outward extension design of the support layer 31, therefore, the windowing area (namely the first open hole A) of the heat dissipation film layer 3 of the display module 1 cannot be exposed, and when edge sealing glue 5 is dispensed subsequently, the edge sealing glue 5 cannot extend to the first open hole A to be in contact with the back film 2 of the display module 1, namely the edge sealing glue 5 is not in direct contact with the back film 2 of the display module 1, so that the poor display effect of the display module 1 caused by the edge sealing glue 5 can be effectively avoided.

Optionally, in the display apparatus provided by an embodiment of the present disclosure, the length of the portion, extending out of the first open hole A, of the support layer 31 is generally greater than 0.2 mm in consideration of the subsequent process capability of the edge sealing glue 5 and the reserved space amount of an internal structure, and the upper limit of the extending length may be limited according to the structural design requirement.

Optionally, in the display apparatus provided by an embodiment of the present disclosure, as shown in FIG. 1, the display apparatus may further include edge sealing glue 5 arranged around the side face of the fingerprint module 4, and the edge sealing glue 5 covers the portion, extending out of the first open hole A, of the support layer 31 and the portion, adjacent to the extending portion, of the heat dissipation film layer 3.

Optionally, the edge sealing glue is dispensed on the periphery of the fingerprint module 4, and by covering the periphery of the fingerprint module 4, the support layer 31 and part of the heat dissipation film layer 3 through the edge sealing glue 5, the fingerprint module 4 can be further fixed. In the display apparatus provided by the embodiment of the present disclosure, in order to ensure that the fingerprint module 4 can be well fixed, on one hand, the pressure-sensitive adhesive 33 of the composite film layer 6 is adopted to be fixed to the fingerprint module 4, and on the other hand, the fingerprint module 4 is packaged on the heat dissipation film layer 3 by adopting black shadowless glue as the edge sealing glue 5.

Optionally, in the display apparatus provided by an embodiment of the present disclosure, as shown in FIG. 1 and FIG. 2, the support layer 31 and the buffer layer 32 may be aligned to each other at the side edges close to the second open hole B so as to increase the accommodating space of the second open hole B.

Optionally, in the display apparatus provided by an embodiment of the present disclosure, the shape of the second open hole B may be matched with the shape of the sensor 41, namely, the shape of the second open hole B depends on the shape of the sensor 41 of the fingerprint module 4, for example, the shape may be a rectangle or circle, so that the sensor 41 can be accommodated in the second open hole B. Moreover, the cross section of the second open hole B may be slightly larger than the size of the sensor 41 so as to cooperate with the bonding error between the fingerprint module 4 and the composite film layer 6.

Optionally, in the display apparatus provided by an embodiment of the present disclosure, as shown in FIG. 1, a gap layer is generally formed in the second open hole B and between the sensor 41 and the display module 1. The specific height of the gap layer may be calculated according to the bonding stress and the stress shrinkage rate of the selected material of the buffer layer 32, the thickness of the material of the buffer layer 32 is determined, and the height of the gap layer is ensured, so that the sensor 41 cannot be in contact with and press the display module 1 in a bonding and pressing process, and the display effect of the display module 1 is not affected.

Optionally, in the display apparatus provided by an embodiment of the present disclosure, the material of the buffer layer 32 may be selected from foam, polystyrene foam plastic or polyethylene foam plastic, these materials may have a buffer effect, and the material of the buffer layer 32 may not be limited by the circumstances in the embodiment of the present disclosure. The buffer layer 32 is used for absorbing stress in the bonding process, so that the stress effect of the bonding procedure on the display module 1 can be reduced, and the product yield is increased.

Optionally, in the display apparatus provided by an embodiment of the present disclosure, the support layer 31 mainly plays a role in securing and supporting the fingerprint module 4, and a harder material, such as a PMMA acrylic material (poly methyl methacrylate) or PC (polycarbonate), needs to be selected.

Based on the same inventive concept, an embodiment of the present disclosure further provides a bonding method for the display apparatus, and the method solving principle of the method is similar to that of the display apparatus, so that implementation of the method may be seen from implementation of the display apparatus, and repeated description is omitted here.

Figure 3:
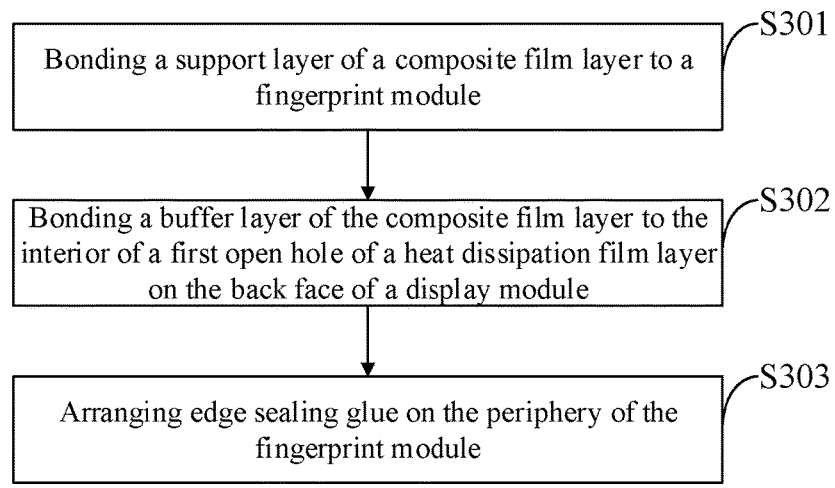
FIG. 3 is a flowchart of a bonding method for a display apparatus provided by an embodiment of the present disclosure.

As shown in FIG. 3, the embodiment of the present disclosure provides a bonding method for the display apparatus, including the following steps:

S301, bonding a support layer of a composite film layer to a fingerprint module; and S302, bonding a buffer layer of the composite film layer to the interior of a first open hole of a heat dissipation film layer on the back face of a display module.

Optionally, the bonding method provided by an embodiment of the present disclosure, as shown in FIG. 3, may further include the following step:

S303, arranging edge sealing glue on the periphery of the fingerprint module so as to further fix the fingerprint module.

According to the bonding method provided by some embodiments of the present disclosure, the composite film layer is used as a support and buffer layer for bonding the fingerprint module to the display module, so that the bonding stress to which the display module is subject can be effectively reduced, the problem of die imprinting during bonding of the fingerprint module is effectively solved, and the product yield is improved. Specifically, the bonding sequence is that the provided bonding method first bonds the fingerprint module to the composite film layer and then bonds same to the back film of the display module, so that the display module can be effectively prevented from being impacted by local stress many times. Moreover, the composite film layer is bonded to the interior of the first open hole formed in the heat dissipation film layer, so that the bonding precision can be improved; and then the fingerprint module, the composite film layer and the display module are packaged through the edge sealing glue, so that a fixing effect can be enhanced.

The composite film layer adopted in the bonding method provided by some embodiments of the present disclosure includes a support layer and a buffer layer which are attached to each other, the buffer layer can absorb stress in the bonding process, reduce the stress effect on the display module and eliminate indentations caused by bonding pressure; and the support layer secures and supports the fingerprint module. Meanwhile, two unconnected side faces of the buffer layer and the support layer are coated with pressure-sensitive adhesives, the composite film layer is bonded to the fingerprint module and the display module through the pressure-sensitive adhesives, and the adopted pressure-sensitive adhesive has high peeling strength, so that it can be guaranteed that the display module, the fingerprint module and the composite film layer are well fixed. One side of the support layer extends out of the buffer layer, so that the supporting layer partially covers the heat dissipation film layer, when edge sealing glue is arranged, the edge sealing glue can cover the extending support layer and part of the heat dissipation film layer without being in direct contact with the display module, and the circumstance that poor displaying such as impressions caused due to stress influence on the back film of the display module are avoided.

The foregoing description is only exemplary of the preferred embodiments of the present disclosure and is illustrative of the principles of the technology employed. It will be appreciated by those skilled in the art that the scope of the disclosure in the present disclosure is not limited to the technical solutions formed by specific combination of the above-mentioned features, but also encompasses other technical solutions formed by any combination of the above-mentioned features or their equivalent features without departing from the inventive concept, for example, technical solutions formed by interchanging the above features and the technical features disclosed in the present disclosure (but not limited to) having similar functions.

It will be apparent to those skilled in the art that various changes and variations may be made in the present disclosure without departing from the spirit and scope of the present disclosure. Thus, if such modifications and variations of the present disclosure fall within the scope of the claims of the present disclosure and their equivalent technologies, the present disclosure is also intended to include such changes and variations.

What is claimed is:

1. A display apparatus, comprising:
   a display module;
   a heat dissipation film layer, located on a back face of the display module, the heat dissipation film layer comprises a first open hole;
   a composite film layer, fixed in the first open hole and comprising a second open hole, the composite film layer comprises a support layer and a buffer layer which are attached to each other, and the buffer layer is close to the display module; and
   a fingerprint module, fixed on a side, facing away from the display module, of the composite film layer, the fingerprint module comprises a sensor accommodated in the second open hole;
   wherein a side, away from the second open hole, of the support layer extends out of the first open hole, and covers a portion, adjacent to the first open hole, of the heat dissipation film layer.

2. The display apparatus according to claim 1, further comprises a back film located between the display module and the heat dissipation film layer.

3. The display apparatus according to claim 1, wherein a length of the portion, extending out of the first open hole, of the support layer is greater than 0.2 mm.

4. The display apparatus according to claim 1, further comprises: edge sealing glue arranged around a side surface of the fingerprint module, wherein the edge sealing glue covers the portion, extending out of the first open hole, of the support layer and a portion, adjacent to the extending portion, of the heat dissipation film layer.

5. The display apparatus according to claim 1, wherein the support layer and the buffer layer are aligned to each other at side edges thereof close to the second open hole.

6. The display apparatus according to claim 5, wherein a shape of the second open hole is matched with a shape of the sensor.

7. The display apparatus according to 1, wherein a gap layer is formed in the second open hole and located between the sensor and the display module.

8. The display apparatus according to claim 1, wherein the support layer and the buffer layer are bonded through a pressure-sensitive adhesive.

9. The display apparatus according to claim 1, wherein the support layer and the fingerprint module are bonded through a pressure-sensitive adhesive.

10. The display apparatus according to claim 1, wherein the buffer layer and the display module are bonded through a pressure-sensitive adhesive.

11. The display apparatus according to claim 1, wherein the buffer layer is made of foam, polystyrene foam plastic or polyethylene foam plastic.

12. The display apparatus according to claim 1, wherein the support layer is made of poly methyl methacrylate, PMMA or polycarbonate, PC.

13. A bonding method for the display apparatus according to claim 1, comprising:
    bonding the support layer of the composite film layer to the fingerprint module; and
    bonding the buffer layer of the composite film layer to the interior of the first open hole of the heat dissipation film layer on the back face of the display module.

14. The bonding method according to claim 13, further comprising:
    arranging edge sealing glue on a side surface of the fingerprint module.

* * * * *